United States Patent
Brailovskiy et al.

(10) Patent No.: US 10,523,170 B1
(45) Date of Patent: Dec. 31, 2019

(54) AUDIO SIGNAL PROCESSING FOR MOTION DETECTION

(71) Applicant: Amazon Technologies, Inc., Seattle, WA (US)

(72) Inventors: Ilya Vladimirovich Brailovskiy, Los Gatos, CA (US); Venkatesh Viswanathan, Coppell, TX (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 0 days.

(21) Appl. No.: 16/122,348

(22) Filed: Sep. 5, 2018

(51) Int. Cl.
| | |
|---|---|
| *H03G 3/32* | (2006.01) |
| *G10L 25/21* | (2013.01) |
| *G10L 25/78* | (2013.01) |
| *H04R 3/00* | (2006.01) |
| *H04R 3/04* | (2006.01) |
| *H04R 1/40* | (2006.01) |
| *H04R 29/00* | (2006.01) |

(52) U.S. Cl.
CPC ............... *H03G 3/32* (2013.01); *G10L 25/21* (2013.01); *G10L 25/78* (2013.01); *H04R 1/406* (2013.01); *H04R 3/005* (2013.01); *H04R 3/04* (2013.01); *H04R 29/005* (2013.01); *H03G 2201/103* (2013.01); *H03G 2201/40* (2013.01); *H04R 2410/01* (2013.01); *H04R 2410/07* (2013.01)

(58) Field of Classification Search
CPC ............... H03G 3/32; H03G 2201/103; H03G 2201/40; G10L 25/21; G10L 25/78; H04R 1/406; H04R 3/005; H04R 3/04; H04R 29/005

USPC ................................................ 381/56, 57
See application file for complete search history.

(56) References Cited

U.S. PATENT DOCUMENTS

| | | | | |
|---|---|---|---|---|
| 4,090,032 | A * | 5/1978 | Schrader | H04R 3/005 381/108 |
| 4,424,511 | A * | 1/1984 | Alberts, Jr. | G01H 3/14 340/500 |
| 5,400,011 | A * | 3/1995 | Sutton | G08B 25/016 340/3.31 |
| 5,907,622 | A * | 5/1999 | Dougherty | H03G 3/32 381/108 |
| 7,822,212 | B2 * | 10/2010 | Merline | H04R 27/00 381/103 |
| 8,641,595 | B2 * | 2/2014 | Basinger | H04R 25/606 600/25 |
| 9,406,313 | B2 * | 8/2016 | Ryan | G10L 25/78 |
| 9,870,719 | B1 * | 1/2018 | Watkins | H04W 76/10 |
| 2009/0316916 | A1 * | 12/2009 | Haila | H04R 3/005 381/57 |
| 2011/0082690 | A1 * | 4/2011 | Togami | H04R 1/406 704/201 |

(Continued)

*Primary Examiner* — David L Ton
(74) *Attorney, Agent, or Firm* — K&L Gates LLP (57) ABSTRACT

Systems and techniques are generally described for audio signal processing for motion detection. In some examples, a first energy level of a first audio signal detected by a first microphone is determined over a first period of time. In some further examples, a first change in the first energy level from a first energy level value to a second energy level value is determined during the first period of time. In some other examples, a determination is made that the first change in the first energy level exceeds a threshold change value associated with the first period of time. In at least some other examples, a bias of an audio amplifier of the first device is adjusted.

20 Claims, 5 Drawing Sheets

(56) References Cited

U.S. PATENT DOCUMENTS

| | | | |
|---|---|---|---|
| 2015/0063575 A1* | 3/2015 | Tan | G06F 16/683 |
| | | | 381/56 |
| 2015/0371638 A1* | 12/2015 | Ma | G10L 15/065 |
| | | | 704/275 |
| 2016/0192069 A1* | 6/2016 | McIntosh | H04R 1/04 |
| | | | 381/56 |

* cited by examiner

AUDIO SIGNAL PROCESSING FOR MOTION DETECTION

BACKGROUND

Camera systems may use a camera and/or a set of cameras to capture video data, audio data, and/or other sensor data from areas of interest. For example, camera devices may be positioned so as to surveil an entryway into a secure area such as a bank vault or an entrance to a private residence. In some examples, computing devices may include sensors such as cameras and/or microphones effective to capture video and audio data. Devices may initiate streaming of video data and/or audio data upon detecting motion within an area of interest monitored by sensors of the device. Video and/or audio data may be streamed over a network to one or more other computing devices for processing, playback, and/or viewing.

DETAILED DESCRIPTION

In the following description, reference is made to the accompanying drawings which illustrate several embodiments of the present invention. It is understood that other embodiments may be utilized and mechanical, compositional, structural, electrical operational changes may be made without departing from the spirit and scope of the present disclosure. The following detailed description is not to be taken in a limiting sense, and the scope of the embodiments of the present invention is defined only by the claims of the issued patent.

In various examples, a location such as an office building, home, outdoor space, and/or any other physical location or combination of physical locations may be monitored by one or more camera devices and/or audio devices. Camera devices may be stand-alone camera devices or may be incorporated into one or more computing devices. In some examples, camera devices and/or computing devices configured in communication with the camera devices may include microphones effective to capture audio data. Audio devices may include one or more microphones. The one or more microphones may be configured in communication with front end audio electronics effective to amplify an electrical audio signal generated by the one or more microphones. Although camera devices are referred to in the present disclosure, the techniques described herein are applicable to audio devices as well.

In various examples, a camera device may be effective to detect motion in the portion of the environment monitored by the camera device (sometimes referred to as a "region of interest"). In some examples, image sensors of camera devices may capture frames of image data and may detect motion by performing computer vision techniques on two or more frames of image data to detect motion. For example, the camera devices may compare luma values of pixels and/or blocks of pixels of consecutive frames of image data. Motion may be detected when the differences in luma between the two frames under comparison exceeds some threshold value. However, such techniques may lead to false positives caused by, for example, changing lighting conditions and/or inconsequential movements such as may be caused by wind. Additionally, motion detection requires two-dimensional processing of frames of image data which may be computationally expensive. In examples where camera devices are battery powered, using two-dimensional computer vision techniques such as those described above to detect motion may consume more power relative to various techniques described below and may therefore result in reduced battery life.

In some other examples, camera devices may send video data over a network to a cloud computing service for motion detection. However, cloud-based techniques, which may execute human detection algorithms, object segmentation and/or detection, etc., can be computationally expensive. Accordingly, in order to reduce cost and cloud-processing cycles, it is beneficial to move motion detection to edge nodes such as the camera devices and/or other computing devices described herein.

In some examples, upon detection of motion, camera devices and/or computing devices configured in communication with camera devices may send captured video data and/or audio data to a central processing device that may be effective to take one or more actions such as storing the video data in one or more memories, processing the video data, sending the video data to one or more other devices for processing, and/or sending an indication or alert indicating that motion has been detected in the environment monitored by the camera device, and/or providing optional access to video and/or captured by the camera device. In various examples, the central processing device may be located within the same building or grouping of buildings as the camera device(s); however, in some other examples, the central processing device may be remotely located from the camera device(s) and may communicate with the camera device(s) over a wide area network (WAN) such as the Internet.

In various examples, camera devices may communicate with one another and/or with a central processing device via a short-range communication protocol such as Bluetooth® or Bluetooth® Low Energy (BLE). In various other examples, the camera device(s) and/or a central processing device may communicate with one another using a wireless local area network (WLAN) using, for example, the IEEE 802.11 standard.

In some examples, a central processing device (e.g., a base station or hub) may communicate with the camera device(s) using a wireless network such as a WLAN via the 900 MHz band or some other frequency band. In some examples, the central processing device may be effective to receive user requests (e.g., from a user mobile device and/or from a companion application on a user mobile device) to access image data and/or video data that is accessible via the central processing device and/or via the camera devices. For example, the central processing device may receive a request from a mobile device (e.g., a mobile device authenticated to the central processing device) for particular video data captured by a particular camera device during a first timeframe (e.g., at a time of day and/or an interval of times). In the example, the central processing device may stream the video to the authenticated mobile device. In some other examples, an authenticated mobile device may request a live video feed from one or more camera device(s). In the example, the central processing device may be effective to control the relevant camera device(s) to begin capturing video data. The central processing device may be effective to control the relevant camera device(s) to stream the video data to the requesting mobile device. In other embodiments, the relevant camera device(s) may send the video data to the central processing device which may, in turn, send the video data to the requesting mobile device (after video processing, for example). In at least some examples, the central processing device may be powered by a wired connection to a wall outlet or other power source. In various other examples, devices may be effective to directly communicate with one or more camera devices without a central processing device. For example, user mobile devices may be effective to request live streams of video from a particular camera device through peer-to-peer connection.

In accordance with various embodiments described herein, processing may be performed by camera devices and/or by one or more devices located proximally to the camera devices such as a base station or other computing device. In at least some other examples, various processing techniques described herein may be performed by a cloud-computing service. In some examples, a portion of the operations described herein may be performed locally by camera devices and/or by a base station that is co-located (e.g., within the same building or buildings) as the camera devices, while one or more other operations may be performed by cloud-computing service with which the one or more camera devices are effective to communicate.

In various examples, the video processing device(s) may be configurable (e.g., through the companion application) as to when, how often, and whether or not to send push notifications, different types of alerts, confirmation requests, and/or inquiries of whether to track and/or store various types of data. Accordingly, the settings of video processing device(s) may be configurable and, in various examples, may be adjusted to account for different privacy concerns of different users. Additionally, a companion application may provide an option to calibrate the front end audio electronics of the various camera device systems described herein.

In various examples, camera devices and/or other edge nodes may be used to detect motion using audio. Using audio to detect motion and trigger video and/or audio streaming may conserve processing resources. For example, an audio stream that may be used for processing and/or audio detection may typically consume drastically reduced bandwidth relative to video (e.g., kbps for audio vs. Mbps for video). Further video processing for motion detection is typically a two-dimensional operation, whereas audio processing for motion detection is one dimensional, simplifying the required computational operations.

For brevity, the disclosure may hereinafter refer to "camera devices" as performing various techniques. However, it should be appreciated that other devices and/or edge nodes which may or may not include cameras may instead be used in accordance with various embodiments described herein. Various techniques are described herein for tuning audio front end electronics of camera devices to dynamically calibrate the front end audio electronics based on ambient noise levels in the environment. In various examples, audio electronics of camera devices may be initially calibrated upon installation. In some examples, during initial calibration an audio signal may be sent from the cloud (e.g., as controlled by a companion application) to each camera device. In response, each camera device may set the bias voltage and noise floor threshold for one or more analog front end amplifiers in the audio signal path. The noise floor threshold may be, for example, a threshold energy level. Signals with energy levels below the noise floor threshold may not be amplified by the front end amplifier of the camera device. Signals with energy levels at or above the noise floor threshold may be amplified and may be passed to a processor of the camera device for further processing. The noise floor threshold and amplifier bias voltage may, in some examples, be stored in a memory of the camera device and/or of the cloud.

Thereafter, a processor of the camera devices may determine an energy level of input audio signals. The energy level may be continually calculated (e.g., calculated every 3 seconds, 10 seconds, 30 seconds, 1.2 minutes, 2 minutes, or any other suitable time interval). If the energy level increases or decreases by more than a threshold amount during a given sampling period or other given time period, a determination may be made that the analog front end audio electronics of the camera device is to be recalibrated. In various examples, after experiencing an abrupt energy level transition (e.g., an increase or decrease in the energy level that exceeds the threshold amount) the new energy level and/or the amount of increase or decrease may be sent to a cloud computing device over a network. In various examples, a segment of the new audio signal may also be sent to the cloud computing device (e.g., 5 milliseconds, 10 milliseconds, 15 milliseconds, or some other suitable segment of the audio signal). In various examples, the threshold amount may represent a threshold energy level difference used to trigger recalibration of audio electronics such as front end amplifier 106*a* of FIG. 1.

The cloud computing device may be effective to receive the audio data (e.g., the new energy level, the amount of increase or decrease, and/or a segment of the new audio signal) and may determine adjustments to the bias and/or noise floor threshold for the particular camera device. Further, when multiple camera devices each experience a sudden transition in audio signal energy levels, the cloud computing service may determine an approximate distance between each camera device and a source of the sound(s) causing the increase in audio energy levels. The biases and/or noise floor thresholds of each of the camera devices may be adjusted based on the relative distance between the particular camera device and the source of the sound(s). The relative energy levels of the audio signals sent by the camera device following the sudden energy transition may be used as proxy values for the distance between the respective camera devices and the source of the sound (e.g., a television or radio being turned on). In various other examples, support vector machines and/or convolutional neural networks may be used to adjust the bias and/or the noise floor threshold of each camera device based on the detected energy level transition.

In some examples, bias tuning may be stored in local memory on the respective camera devices. Accordingly, in such examples, instead of sending the energy level data to the cloud, the energy level data may be stored in internal memory of the camera device. Camera devices detecting a sudden change in energy level (e.g., a difference in energy level that exceeds a threshold value for a given time period) may send an indication of the resulting energy level after the change to each other camera device in a camera system. A processor of each camera device may determine whether or not to increase or decrease the front end audio amplifier bias and by how much based on the received indications of energy levels and/or based on the energy level change experienced by the camera device. Alternatively, the energy level data may be stored in the cloud. Cloud computing devices may determine the bias levels for particular camera devices based on the relative energy levels of audio signals experienced by the camera devices following a sudden energy level increase or decrease.

In various examples, the bias and noise floor threshold of camera devices that are closest to a noise source (e.g., a television, radio, ambient noise, etc.) may be increased to increase the amplification and noise floor to avoid masking of input sound signals by the noise source. In some examples, bias may be decreased or may be kept the same for camera devices that are further away from the noise source. In general, dynamic tuning of amplifier bias for front end audio electronics may optimize battery life by adjusting gain and noise floor thresholds according to audio energy levels detected by the particular camera device.

In various examples, dynamic recalibration of the bias and noise floor threshold of camera devices and/or audio devices may be configurable with a companion application associated with operation of the camera devices and/or audio devices. In some examples, a user may configure the audio devices and/or camera devices such that a camera device and/or audio device that is closest to the source of a sudden increase in audio energy level (e.g., the camera closest to a television that is turned on) may not be used for motion detection. Accordingly, the camera and/or audio device that is closest to the source of noise may not be used for the determination of motion within the environment. Instead, other cameras and/or audio devices further away from the noise source may be used as these devices may be less prone to masking from the noise source. Additionally, in some examples, when a sudden increase in noise level is detected by one or more devices, the bias level and/or noise floor threshold may be adjusted within each device based on that device's proximity to the source of the noise. As further described below, proximity to the noise source may be determined based on the magnitude of the energy level experienced by each device relative to the magnitude of the energy level experienced by other devices for a given audio event (e.g., a television turning on). In some examples, a user may configure a system of devices (e.g., camera devices, audio devices, and/or some combination thereof) such that the bias level of the front end audio of each device is increased relative to its proximity to the noise source. Accordingly, the closest camera to the noise source may have a gain of a front end amplifier increased by a large amount, while the next closest camera may have a gain increased by a lesser amount, and so on. In at least some examples, devices that are furthest from the noise source may not adjust gain and/or noise floor, and in some cases may be configured to decrease gain.

In some other example embodiments, one or more camera devices may be disposed in and/or may monitor an outdoor location or area. Ambient sound levels (e.g., noise) may fluctuate due to changes in prevailing and/or expected weather conditions (e.g., magnitude of wind speed, wind direction, precipitation, traffic conditions, airplane traffic, etc.). Front end audio amplifiers may be dynamically tuned by increasing/decreasing bias and/or noise floor thresholds according to prevailing and/or predicted weather events. Weather update data (e.g., weather report data and/or weather information) may be received from the Internet via a cloud computing service and/or via internet weather data services and/or sources. Weather report data may be used to trigger recalibration of front end audio amplifiers of outdoor camera devices. For example, weather report data received by a cloud computing service associated with a camera device A may indicate that winds are blowing in a southeasterly direction at 5 knots in the vicinity of camera device A. Cloud computing service may perform a lookup based on the weather data and/or may use machine learning techniques to determine an appropriate bias adjustment for the front end audio amplifier of camera device A. In the example, the cloud computing service may increase the bias and the noise floor threshold of the front end audio amplifier of camera device A to avoid masking by the noise of the wind.

In various other examples embodiments, the camera device systems described herein may comprise a recognized person filter to avoid false positives due to spoken names commonly associated with a monitored location/region of interest. For example, a camera device system may be deployed in a single family home. It may be desirous to avoid triggering the camera devices of the home from streaming video and/or audio due to family members living within the home calling one another's names and/or nicknames. Accordingly, during a setup or calibration period, pitch periods of names commonly used in conversation by members of the household may be determined and stored in a memory (e.g., within a local memory of the camera devices). Pitch periods generally refer to a data representation of the periodic qualities of a sound waveform generated by a particular speaker uttering a particular word, name, and/or phrase. For example, a family member may utter the word "dog". The pitch period for the word "dog", as uttered by the family member, may be determined by applying an average magnitude difference function to compare segments of the signal (e.g., the wave form of the spoken word "dog") with other segments of the signal to determine a match. Once the period of a quasiperiodic signal is determined, the period may be inverted to generate the fundamental frequency.

Pitch periods of voiced audio signals (and/or fundamental frequencies) received by the camera devices may be compared to pitch periods (and/or fundamental frequencies) stored in memory (e.g., within a lookup table). If a match is found between a pitch period found in a voiced signal detected by a camera device and a previously-stored pitch period corresponding to a family member's name or some other name associated with the home, live streaming of video and/or audio may not be triggered. For example, if a pitch period associated with a detected signal matches the pitch period of the family member uttering the word "dog", as described above, to within a tolerance value, a determination may be made that the speaker is the family member and that therefore no streaming of audio data and/or video data should be initiated.

In various examples, autocorrelation may be used to determine the pitch period. The pitch period is based on the number of vowels in speech. Accordingly, the recognized person filter may be language agnostic. Additionally, the pitch period is different between different speakers of the same word. Accordingly, different speakers may be distinguished from one another using the recognized person filter. Accordingly, if a non-family member speaks the name of a family member, the pitch period may be different from any previously stored pitch periods. As such, the speech may be detected and may trigger streaming of video and/or audio by the camera devices. In at least some examples, a tolerance may be used when comparing pitch periods to one another to account for natural variation in human speech and/or noise. An example tolerance may be a pitch period that differs by no more than 25%, 10%, 5%, or some other acceptable tolerance value.

In various examples embodiments, an audio motion detector is generally described. Input audio signals that do not exceed the current noise floor threshold for a particular camera device may not be amplified for further processing by the audio motion detector. Input audio signals that do exceed the current noise floor threshold for a given camera device may be split into two signal paths. The first signal path may be low pass filter the signal to attenuate signals above approximately 4 kHz bandwidth. Thereafter, the low pass filtered signal may be input to a zero crossing detector to separate voiced signal components (e.g., spoken components or speech components) from unvoiced components (e.g., non-speech components such as footsteps, doors opening/closing, etc.). The audio motion detector may calculate the energy level of the unvoiced audio signal and determine the trend in the energy level over time. If the energy level trend increases over time, a human motion event (e.g., human motion toward the microphone of the camera device) may be determined to have occurred and streaming of audio and/or video from the camera device to one or more other computing devices may be initiated.

The voiced signal output by the zero crossing detector may be sent to the recognized person filter to determine whether or not the voiced signal corresponds to a person associated with the camera system (e.g., a family member, employee, etc.). If no matches are found by the recognized person filter, the audio motion detector may calculate the energy level of the voiced audio signal and determine the trend in the energy level over time. If the energy level trend increases over time, a human motion event (e.g., human motion toward the microphone of the camera device) may be detected and streaming of audio and/or video from the camera device to one or more other computing devices may be initiated. Conversely, if the energy level trend does not increase over time the voiced audio signal may be due to a background voice, the radio, the television, etc.

In the second signal path, the average energy of the audio input signal may be determined. Thereafter trend in audio energy level may be calculated over a period of time. If a determination is made that there is a sudden change in the energy level (e.g., the energy level increases or decreases according to a step-wise function), a determination may be made that no motion event has occurred.

Figure 1:
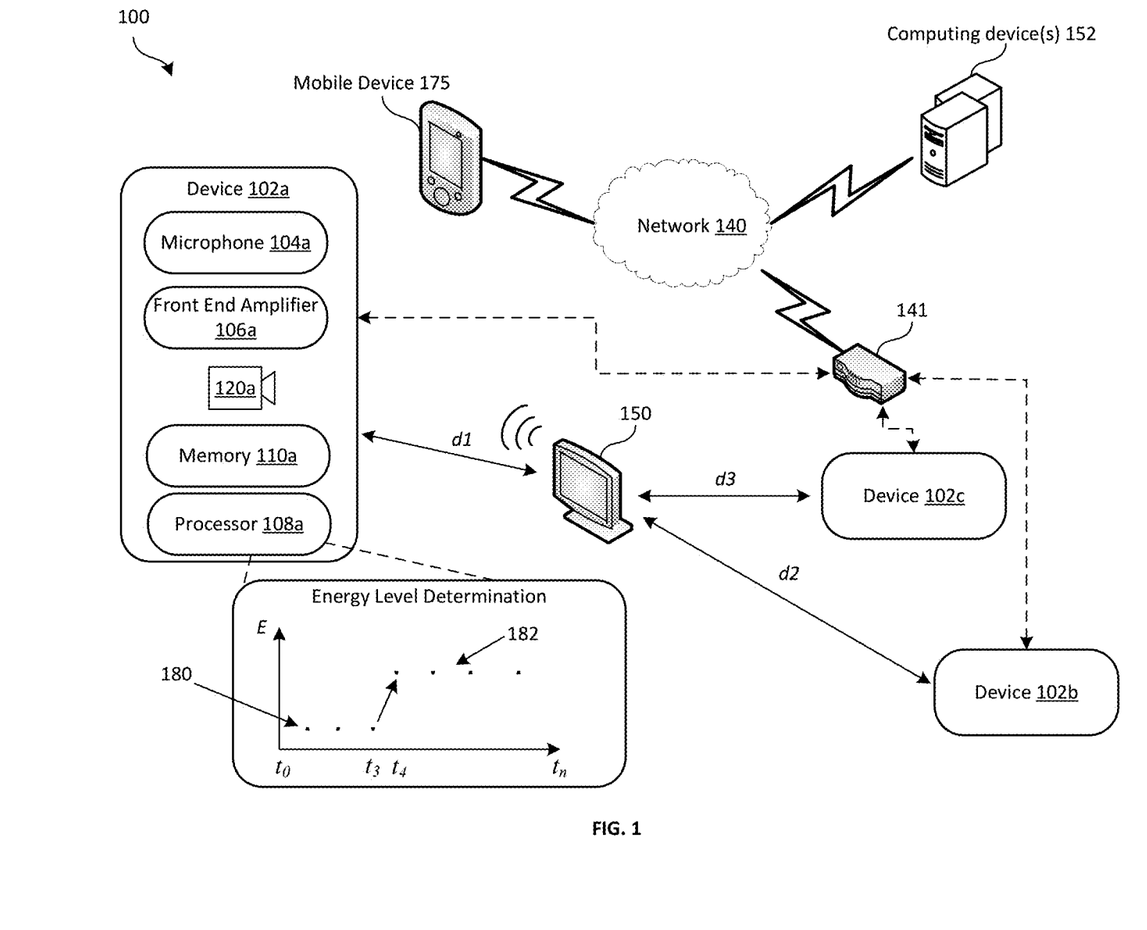
FIG. 1 is a diagram illustrating a motion detection system effective to dynamically adjust audio signal input gain, in accordance with various aspects of the present disclosure.

FIG. 1 is a diagram illustrating a camera system 100 effective to dynamically adjust audio signal input gain, in accordance with some embodiments of the present disclosure. System 100 may include one or more devices (e.g., devices 102a, 102b, 102c). System 100 may comprise a wireless access point 141. In various examples, wireless access point 141 may be effective to allow devices 102a, 102b, and/or 102c to communicate with each other (e.g., via a local area network) and/or with one or more other computing devices over a network 140 such as mobile device 175 and/or television 150 (or other computing devices). In various examples, network 140 may be the Internet or another wide area network. In at least some examples, wireless access point 141 may comprise a router.

In some examples, device 102a may comprise a microphone 104a, a front end amplifier 106a, a camera 120a, a processor 108a, and/or a memory 110a. Additionally, device 102a may comprise a wireless radio for transmitting and receiving wireless communications. Although not depicted in FIG. 1, in various examples, devices 102a, 102b, and/or 102c may be configured in communication with a central processing device. In at least some examples, the central processing device may be effective to perform one or more of the various techniques described herein. In at least some other examples, the one or more of the various techniques described herein may be performed by respective processors of devices 102a, 102b, and/or 102c unless otherwise described herein.

Although three devices 102a, 102b, and/or 102c are shown in the example illustrated in FIG. 1, any number of devices may be used in accordance with the present disclosure. Additionally, devices 102b and/or 102c may include the same components or different components apart from what is shown with respect to device 102a. In at least some examples, devices 102a, 102b, and/or 102c may be battery-powered devices.

Device 102a may be a camera device effective to monitor a particular region of interest. Microphone 104a of device 102a may receive an audio signal and may convert the audio signal into an electrical signal representative of the audio signal. To simplify the description herein, the term "audio signal" may refer to the electrical signal generated by the microphone and representative of the corresponding audio. The front end amplifier 106a may comprise analog electronics (e.g., one or more filters, biasing circuits, and/or amplifiers) effective to amplify an input audio signal. Front end amplifier 106a may initially be calibrated upon manufacture and/or upon installation of device 102a. Calibration may include setting a noise floor threshold and bias voltage or current for front end amplifier 106a using a bias circuit. Audio signals that are below the noise floor threshold may be attenuated by front end amplifier 106a. The bias voltage may affect the gain of the front end amplifier 106a. In general, increasing the bias voltage during linear operation of the amplifier (e.g., operation in active mode) may increase the gain. Similarly, decreasing the bias voltage while operating the amplifier in the linear region (active mode) may decrease the gain.

Processor 108a may be effective to calculate the energy level (e.g., determine energy level values) of the audio signal generated by microphone 104a over time in accordance with instructions stored in memory 110a. In an example, a television 150 may be turned off at a time $t_0$. Accordingly, absent other dynamic noise, a first energy level value 180 may be observed at time $t_0$. Between time $t_3$ and time $t_4$ television 150 may be turned on. In various examples, television 150 may generate a "start up" noise upon being powered on, such as a chime, tone, or other noise to signal to a user that the television 150 has been turned on. Accordingly, as shown in FIG. 1, processor 108a may determine that the energy level has increased from energy level value 180 to energy level value 182 between times $t_3$ and $t_4$. The difference value between energy level values 180 and 182 may exceed an energy level threshold value for the given time period (e.g., $t_4-t_3$). In response to a determination that the energy level threshold has been exceeded processor 108a may initiate recalibration of front end amplifier 106a.

In various examples, devices 102a, 102b, and/or 102c may be located at different distances and/or different positions with respect to television 150. For example, device 102a may be located a distance d1 from television 150.

Device 102b may be located a distance d2 from television 150, and device 102c may be located a distance d3 from television 150. In various other examples, different physical obstructions may be located between the sound emitted device (e.g., television 150) and one or more camera devices (such as device 102a, 102b, and/or 102c). For example, device 102b may be located inside a house around a corner from television 150. As such, an average energy level of an audio signal detected by device 102b from television 150 may have a smaller magnitude relative to an average energy level detected by a device that has an unobstructed path to television 150.

When television 150 is turned on and emits a startup sound or sound from a program being displayed by television 150, each of devices 102a, 102b, and 102c may experience a sudden change in input audio signal energy levels, as described above. For example, a determination may be made by a processor of each of devices 102a, 102b, and 102c that the magnitude of the energy change over a particular time period (e.g., 1 second, 0.5 seconds, 5 seconds, the sampling period of energy levels of the signal, or any other suitable time period) exceeds a threshold energy level difference, as described above.

In various other examples, instead of determining a sudden energy level change locally on the devices 102a, 102b, and/or 102c, devices 102a, 102b, and 102c may instead send indications of input audio signal energy level to one or more computing devices 152 over network 140. The one or more computing devices 152 may comprise a cloud computing service and may be effective to determine whether or not the change in energy level values of the input audio signals received from devices 102a, 102b, and 102c exceed threshold energy level differences. Additionally, in at least some examples, devices 102a, 102b, and/or 102c may send segments of the audio signals (e.g., 50 milliseconds, 1 second, 3 seconds, or any suitable segment length) over network 140 to computing devices 152. Computing devices 152 may use such segments to determine trends in the energy level of the audio signals for each of the devices.

In some example embodiments, computing device(s) 152 may determine an updated bias level for the front end amplifiers of each of the camera devices based on the energy level associated with each of the devices and based on the audio segments received from the devices. Additionally, in some examples, computing device(s) 152 may determine an updated noise floor threshold for each of the devices. Computing device(s) 152 may send respective indications of the new bias level and/or new noise floor threshold value to the respective devices 102a, 102b, and 102c. In response, the devices 102a, 102b, and/or 102c may tune their respective front end amplifiers using the new bias voltage (or current) and/or the new noise floor thresholds specified by computing device(s) 152.

In at least some other examples, after determining a sudden energy level change locally on the devices 102a, 102b, and/or 102c, each of the devices 102a, 102b, and 102c may send respective indications of the current input audio signal energy level to the other devices. For example, after device 102a has determined that a sudden energy level change has occurred, device 102a may send an indication of the new input audio signal energy level to devices 102b and 102c. Similarly, device 102b may send an indication of its new input audio signal energy level to devices 102a and 102c, and device 102c may send an indication of its new input audio signal energy level to devices 102a and 102b. The audio signal energy levels received from the other devices may be stored locally in memory. Thereafter, a processor of each device may determine an updated bias and/or noise floor threshold based on the different energy levels experienced by the various devices in camera system 100.

In general, a device that is closest to a noise source (e.g., television 150) may experience the highest magnitude energy level after the noise source is activated due to the proximity of the device to the noise source. The bias of the device experiencing the highest magnitude energy level after the sudden energy level change (e.g., a change that exceeds a threshold energy level difference) is typically increased to reduce masking due to the noise from the noise source. In some examples, the bias of the device experiencing the lowest magnitude energy level after the sudden energy level change may be left unchanged or may be decreased, as there may be little chance of masking. In various examples, devices experiencing intermediate energy level audio signals (e.g., those devices that are neither the closest nor the furthest away from the noise source) may have their bias adjusted according to the magnitude of the energy level detected by the particular device and/or according to the characteristics of the segment of the audio signal sent to computing device(s) 152 for further processing. In various examples, and as described above, bias adjustment may be conditioned upon a user-controlled policy configured via a companion application used to control the various audio and/or camera devices. In at least some examples, the bias level may be increased and/or decreased based on the relative proximity to the source of a noise causing a sudden increase in audio energy level. For example, the closest device to a noise source may increase the bias by the largest amount (to reduce masking) while each device located further away may increase its bias by a progressively lesser amount, based on the distance of the device from the noise source. As previously described, the magnitude of the resulting energy level of the audio signal detected by each device (e.g., after the turning on of a television or radio) may be used as a proxy for the distance of the device from the noise source.

Figure 2:
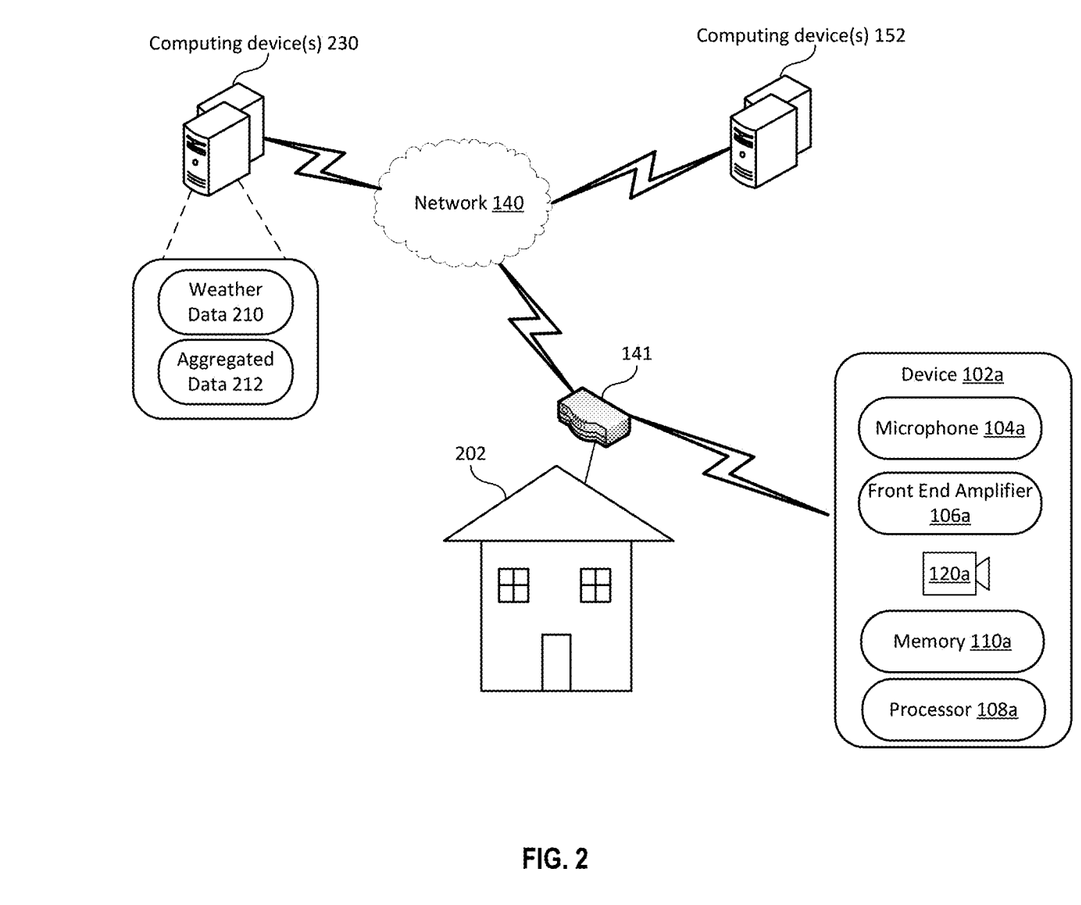
FIG. 2 depicts an example motion detection system effective to dynamically adjust audio signal input gain based on external data, in accordance with various embodiments of the present disclosure.

FIG. 2 depicts an example motion detection system effective to dynamically adjust audio signal input gain based on external data, in accordance with various embodiments of the present disclosure.

In various examples, one or more camera devices or other motion detection devices may be located outside. For example, in FIG. 2, device 102a may be located outside of building 202. In various examples, device 102a may be a camera device effective to monitor one or more outside regions of interest and/or a particular portion of building 202 (e.g., an entrance). Device 102a may detect ambient sounds of the outdoor environment. Motion detection devices using audio to detect motion, as described herein, may face a different set of challenges when operated outdoors as opposed to indoors. For example, weather events such as precipitation, thunder, and/or wind may cause increased noise, which may, in turn, lead to masking of other audio signals of interest such as human voices and/or unvoiced sounds.

Accordingly, in various examples, outdoor motion detection devices may be effective to communicate with one or more computing devices 230. Computing device(s) 230 may be, for example, weather services that may provide weather data 210 regarding current weather events based on the location of device 102a. In various examples, device 102a may communicate with computing device(s) 230 through access point 141 (which may be located inside building 202, in some examples). Access point 141 may communicate with computing device(s) 230 through network 140 and may receive weather data 210 and/or other aggregated data 212. Examples of other aggregated data 212 may be, for example, traffic data, or data regarding particular events in the locality of device 102a (e.g., the city, zip code, GPS coordinate, etc.) that may be noisy and may warrant dynamic calibration of front end audio electronics. For example, aggregated data 212 may indicate that a parade is going to be passing building 202 at a particular time or that fireworks will be set off at a particular time based on a particular holiday.

In various examples, weather data 210 and/or aggregated data 212 may be collected by computing device(s) 152 which may, in turn, dynamically determine bias levels for front end amplifier 106a based on the weather data 210 and/or aggregated data 212. In various other examples, weather data 210 and/or aggregated data 212 may be sent to device 102a and processor 108a may dynamically determine bias levels and/or noise floor thresholds to tune the front end amplifier 106a according to the weather event or other event. In at least some examples, the amount of modification of the bias may be dependent upon a particular weather event or other expected noise-generating event. For example, a wind speed of X mph may be commensurate with a particular noise energy level. Accordingly, the bias levels of front end amplifier 106a of an outdoor device 102a may be increased by an amount sufficient to reduce masking by the noise energy level.

In various examples, device 102a may be battery powered. Recalibration of front end amplifier 106a may consume power. Accordingly, in some examples, dynamic tuning based on weather data 210 and/or aggregated data 212 may be performed sporadically (e.g., based on weather events or other events that are likely to cause masking of motion detection events based on an expected energy level magnitude associated with the events) in order to conserve battery life. Upon installation of an outdoor monitoring device (e.g., device 102a in FIG. 2), a user may initially be prompted to calibrate the front end amplifier 106a during a quiet period (e.g., a time with low wind speed and little ambient noise) to provide a relatively low noise floor for the initial calibration.

Figure 3:
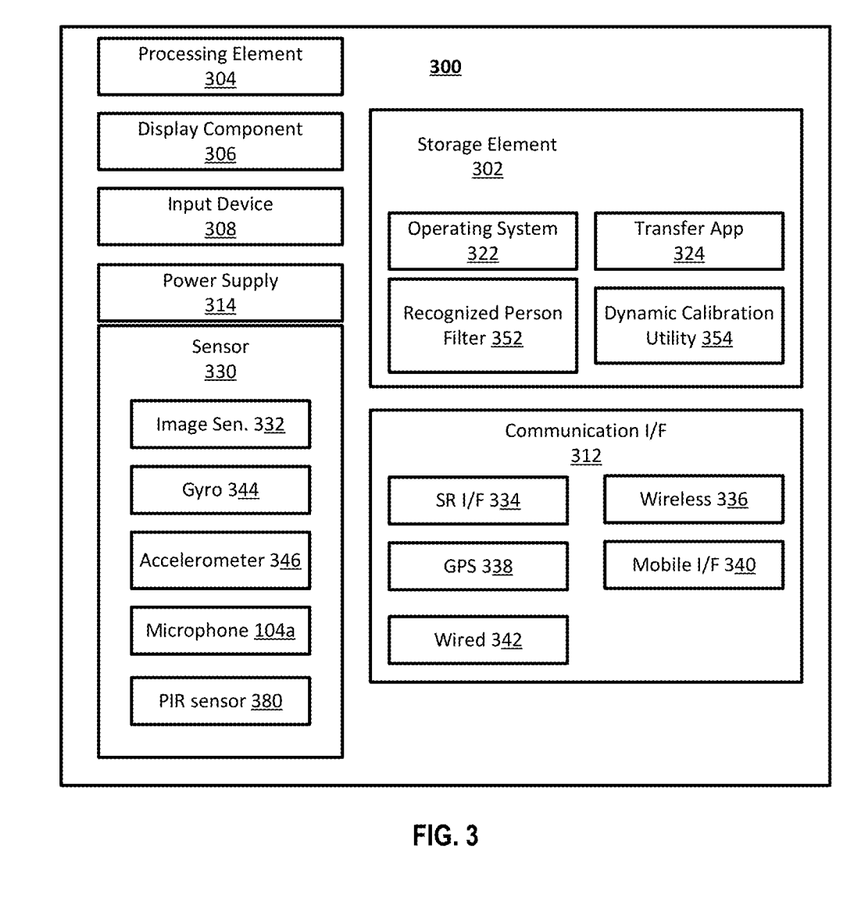
FIG. 3 is a block diagram showing an example architecture of a computing device that may be used in accordance with various aspects of the present disclosure.

FIG. 3 is a block diagram showing an example architecture 300 of a device, such as devices 102a, 102b, 102c, the central processing device (e.g., a base station configured in communication with devices 102a, 102b, and/or 102c) and/or other devices described herein. It will be appreciated that not all devices will include all of the components of the architecture 300 and some user devices may include additional components not shown in the architecture 300. The architecture 300 may include one or more processing elements 304 for executing instructions and retrieving data stored in a storage element 302. The processing element 304 may comprise at least one processor. Any suitable processor or processors may be used. For example, the processing element 304 may comprise one or more digital signal processors (DSPs). The storage element 302 can include one or more different types of memory, data storage, or computer-readable storage media devoted to different purposes within the architecture 300. For example, the storage element 302 may comprise flash memory, random-access memory, disk-based storage, etc. Different portions of the storage element 302, for example, may be used for program instructions for execution by the processing element 304, storage of images or other digital works, and/or a removable storage for transferring data to other devices, etc.

The storage element 302 may also store software for execution by the processing element 304. An operating system 322 may provide the user with an interface for operating the user device and may facilitate communications and commands between applications executing on the architecture 300 and various hardware thereof. A transfer application 324 may be configured to send and/or receive image and/or video data to and/or from other devices (e.g., between devices 102a, 102b, 102c, and access point 141, computing device(s) 152, 230 and/or between a central processing device, such as a base station and architecture 300. In some examples, the transfer application 324 may also be configured to upload received and/or captured images and/or audio to another device that may perform processing as described herein (e.g., a mobile device or another computing device). Additionally, the transfer application 324 may be configured to send alerts and/or notifications to one or more mobile computing devices associated with the system depicted in FIG. 1. For example, an alert may be sent to a mobile device 175 of a person associated with building when one or more of devices 102a, 102b, and 102c have detected motion using the various techniques described herein. The alert and/or notification may include a link to a live stream of video and/or audio captured by the relevant device in response to the detection of motion.

In various examples, storage element 302 may include a dynamic calibration utility 354. Dynamic calibration utility 354 may be effective to dynamically recalibrate front end audio electronics (e.g., front end amplifier 106a of FIG. 1) in response to changes in ambient sound level within the environment monitored by the device represented by architecture 300. For example, dynamic calibration utility 354 may be effective to adjust the bias voltage and/or the noise floor threshold of front end audio electronics in response to the determination that a sudden energy level change in audio detected by microphone 104a has occurred. Dynamic calibration utility 354 may be used to determine energy levels of input audio signals. Upon the determination that the energy level of an input audio signal has increased or decreased by more than a threshold difference amount during a particular period of time, dynamic calibration utility 354 may be effective to recalibrate the front end audio electronics, as described herein.

In various examples, storage element 302 may include a recognized person filter 352. Recognized person filter 352 may store pitch periods associated with commonly used names within a particular environment (e.g., family member's names within a home) as spoken by different family members. In various examples, recognized person filter 352 may use average squared mean difference function (ASMDF) and/or other autocorrelation algorithms to determine whether voiced speech detected by microphone 104a corresponds to a pitch period stored by recognized person filter 352. As described in further detail below, if a pitch period of a voiced audio signal corresponds to a known pitch period stored by recognized person filter 352, no motion may be detected as a consequence of the voiced audio signal, as it may be determined that the voiced audio signal is associated with an authorized person (e.g., a family member within the home).

When implemented in some user devices, the architecture 300 may also comprise a display component 306. The display component 306 may comprise one or more light-emitting diodes (LEDs) or other suitable display lamps. Also, in some examples, the display component 306 may comprise, for example, one or more devices such as cathode ray tubes (CRTs), liquid-crystal display (LCD) screens, gas plasma-based flat panel displays, LCD projectors, raster projectors, infrared projectors or other types of display devices, etc.

The architecture 300 may also include one or more input devices 308 operable to receive inputs from a user. The input devices 308 can include, for example, a push button, touch pad, touch screen, wheel, joystick, keyboard, mouse, trackball, keypad, light gun, game controller, or any other such device or element whereby a user can provide inputs to the architecture 300. These input devices 308 may be incorporated into the architecture 300 or operably coupled to the architecture 300 via wired or wireless interface. In some examples, architecture 300 may include a microphone 104a for capturing sounds, such as voice commands. A voice recognition engine may interpret audio signals of sound captured by microphone 104a. In some examples, the voice recognition engine may listen for a "wake word" to be received by microphone 104a. Upon receipt of the wake word, the voice recognition engine may stream audio to a voice recognition server for analysis. In various examples, the voice recognition engine may stream audio to external computing devices via communication interface 312. The microphone 104a may receive sound waves from the local environment of architecture 300 and may generate electrical signals (e.g., input audio signals) corresponding to the sound waves. Front end audio electronics (e.g., front end amplifier 106a) may be effective to filter out input audio signals that are below a noise floor threshold of front end amplifier 106a. As previously described, dynamic calibration utility 354 may be effective to determine the energy of the input audio signal on a continuous, semi-continuous, periodic, semi-periodic or otherwise repeating basis. In at least some examples, dynamic calibration utility 354 may use a Fast Fourier transform (FFT) or other signal processing technique to determine the energy of the input audio signal. Additionally, portions of input audio signal that pass the noise floor threshold may be amplified (or attenuated, depending on the gain) by front end amplifier 106a.

When the display component 306 includes a touch-sensitive display, the input devices 308 can include a touch sensor that operates in conjunction with the display component 306 to permit users to interact with the image displayed by the display component 306 using touch inputs (e.g., with a finger or stylus). The architecture 300 may also include a power supply 314, such as a wired alternating current (AC) converter, a rechargeable battery operable to be recharged through conventional plug-in approaches, or through other approaches such as capacitive or inductive charging.

The communication interface 312 may comprise one or more wired or wireless components operable to communicate with one or more other user devices. For example, the communication interface 312 may comprise a wireless communication module 336 configured to communicate on a network according to any suitable wireless protocol, such as IEEE 802.11 or another suitable wireless local area network (WLAN) protocol. A short range interface 334 may be configured to communicate using one or more short range wireless protocols such as, for example, near field communication (NFC), Bluetooth, BLE, etc. A mobile interface 340 may be configured to communicate utilizing a cellular or other mobile protocol. A Global Positioning System (GPS) interface 338 may be in communication with one or more earth-orbiting satellites or other suitable position-determining systems to identify a position of the architecture 300. A wired communication module 342 may be configured to communicate according to the USB protocol or any other suitable protocol.

The architecture 300 may also include one or more sensors 330 such as, for example, one or more position sensors, image sensors, and/or motion sensors. An image sensor 332 is shown in FIG. 3. Some examples of the architecture 300 may include multiple image sensors 332. For example, a panoramic camera system may comprise multiple image sensors 332 resulting in multiple images and/or video frames that may be stitched and may be blended to form a seamless panoramic output.

Motion sensors may include any sensors that sense motion of the architecture including, for example, gyro sensors 344, passive infrared (PIR) sensors 380, and accelerometers 346. Motion sensors, in some examples, may be used to determine an orientation, such as a pitch angle and/or a roll angle of a camera. The gyro sensor 344 may be configured to generate a signal indicating rotational motion and/or changes in orientation of the architecture (e.g., a magnitude and/or direction of the motion or change in orientation). Any suitable gyro sensor may be used including, for example, ring laser gyros, fiber-optic gyros, fluid gyros, vibration gyros, etc. The accelerometer 346 may generate a signal indicating an acceleration (e.g., a magnitude and/or direction of acceleration). Any suitable accelerometer may be used including, for example, a piezoresistive accelerometer, a capacitive accelerometer, etc. In some examples, the GPS interface 338 may be utilized as a motion sensor. For example, changes in the position of the architecture 300, as determined by the GPS interface 338, may indicate the motion of the GPS interface 338.

Figure 4A:
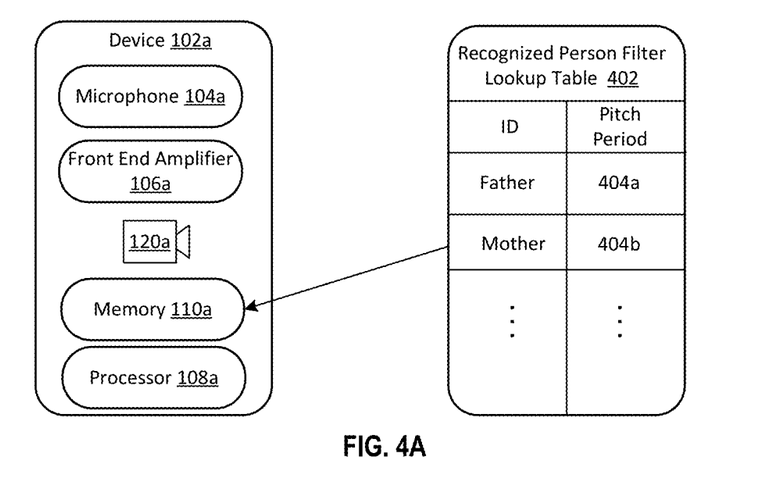
FIG. 4A depicts an example of a lookup table for a recognized person filter, in accordance with various embodiments of the present disclosure.

FIG. 4A depicts an example of a lookup table 402 for a recognized person filter (e.g., recognized person filter 352 of FIG. 4B), in accordance with various embodiments of the present disclosure.

Recognized person filter 352 may store pitch periods associated with commonly used names or other words/phrases within a particular environment (e.g., family member's names within a home) as spoken by different family members. As depicted in FIG. 4A, recognized person filter may use a recognized person filter lookup table 402. The recognized person filter lookup table may have an ID field for storing identifiers related to individuals associated with a location monitored by device 102a. The ID may be a name of the individual and/or a identification code identifying the individual. In the example depicted in FIG. 4A, "Father" and "Mother" may represent two individuals of a family unit living in a home monitored by device 102a. Recognized person filter lookup table 402 may also store a pitch period field to store pitch periods associated with different IDs. For example, ID 404a associated with "Father" may be the pitch period of a name commonly said by father (e.g., the name of a child living in the house). It is to be appreciated that other people besides family members and that pitch periods of words and/or phrases other than names may be stored in recognized person filter lookup table 402 in accordance with the present disclosure.

Fields of recognized person filter lookup table 402 may be populated using an initial calibration stage. For example, a user of device 102a may speak commonly-used names for a given residence or other monitored location into the microphone of a mobile device executing a companion application or into microphone 104a of device 102a. Processor 108a and/or a cloud computing service in communication with device 102a may determine a pitch period for the spoken names and/or other words. In some examples, processor 108a and/or the cloud computing service may associate the pitch period with an ID and/or may prompt a user to identify the pitch period using a companion application. The ID and pitch period may be stored in association with one another in recognized person filter lookup table 402.

Figure 4B:
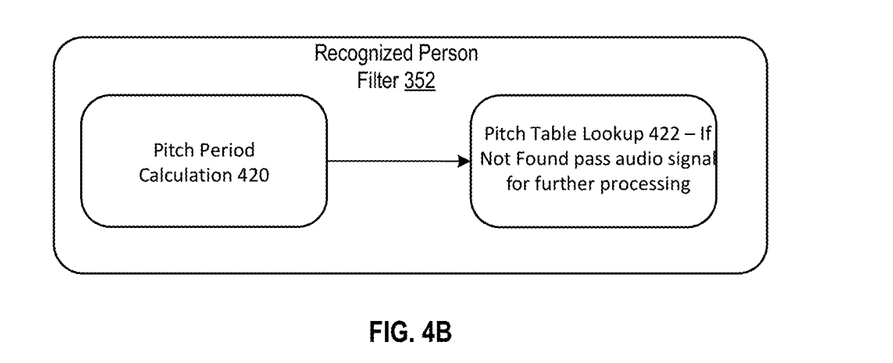
FIG. 4B depicts an example runtime operation of a recognized person filter, in accordance with various embodiments of the present disclosure.

As depicted in FIG. 4B, during runtime, recognized person filter 352 may use average squared mean difference function (ASMIDF) and/or other autocorrelation algorithms at pitch period calculation action 420 to determine whether voiced speech detected by microphone 104a of device 102a corresponds to a pitch period stored by recognized person filter lookup table 402. Recognized person filter 352 may use the pitch period determined at action 420 to perform a lookup at action 422 in which the pitch period calculated at action 420 is used as a search query (e.g., a search term) to recognized person filter lookup table 402. As described in further detail below, if a pitch period of a voiced audio signal corresponds to a known pitch period stored in recognized person filter lookup table 402, no motion may be detected as a consequence of the voiced audio signal, as it may be determined that the voiced audio signal is associated with an authorized person (e.g., a family member within the home). Conversely, if the pitch period of voiced audio does not correspond to any pitch period entries in recognized person filter lookup table 402, the voiced audio signal may be passed along for further processing to determine whether or not motion should be detected based on the voiced audio signal.

Figure 5:
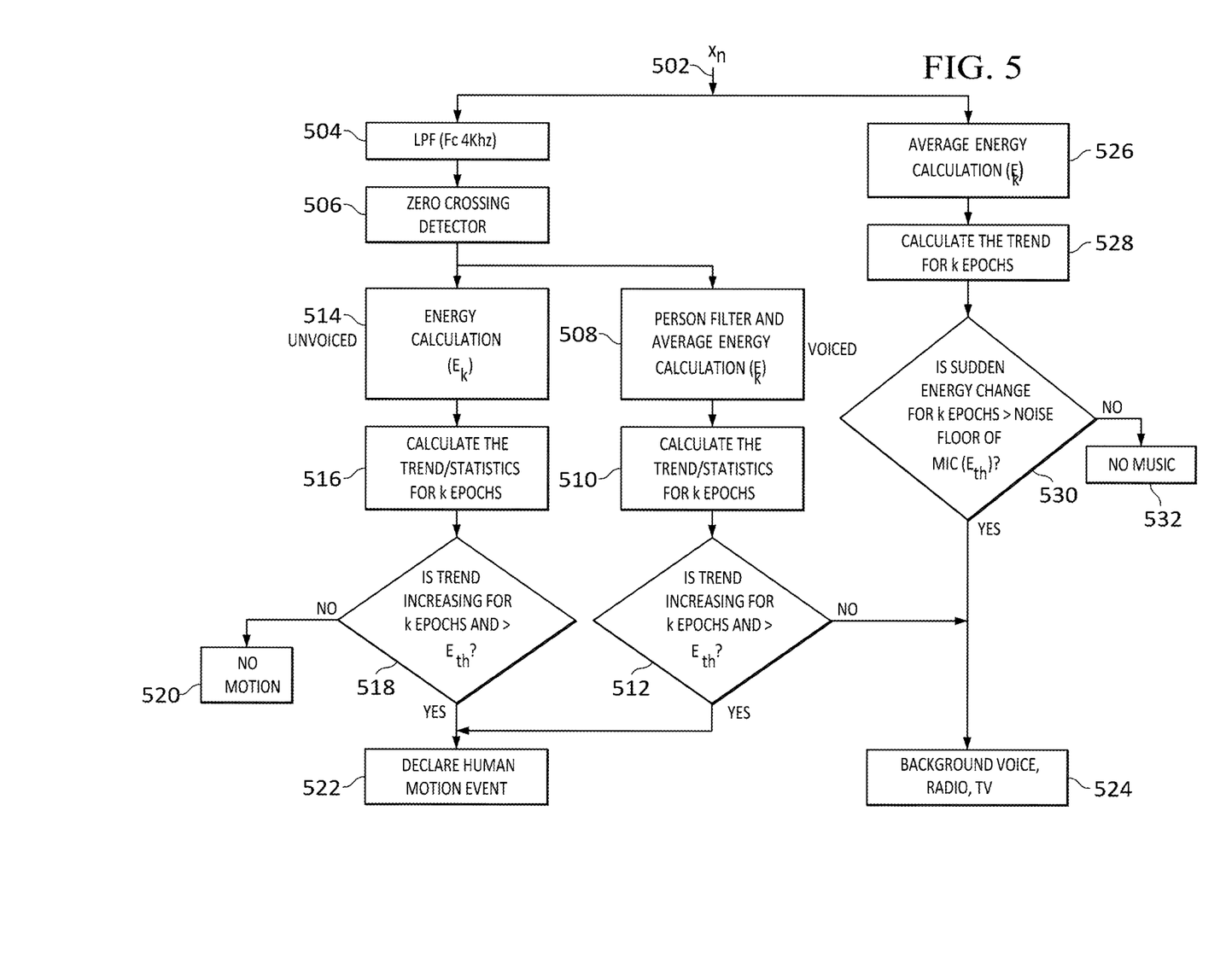
FIG. 5 depicts an example process for motion detection using audio, in accordance with various embodiments of the present disclosure.

FIG. 5 depicts an example process for motion detection using audio, in accordance with various embodiments of the present disclosure. In various examples, the motion detection process depicted in FIG. 5 may be executed by processor 108a of device 102a. In some other examples, the motion detection process depicted in FIG. 5 may be executed by one or more other computing devices, such as computing device(s) 152. In some further examples, the motion detection process depicted in FIG. 5 may be executed by some combination of processor 108a and one or more other computing devices.

A microphone (e.g., microphone 104a) of a motion detection device (e.g., device 102a) may receive sound waves and generate an electrical input audio signal $x_n$ [502]. The input audio signal $x_n$ may be split into two different signal paths. In one signal path, the input audio signal $x_n$ may be processed for human speech. Accordingly, at [504] the input audio signal $x_n$ may be input to a low pass filter with a cutoff frequency of about 4 kHz. Human speech typically has a frequency band of between about 300 Hz to about 3400 Hz. Accordingly, frequencies higher than 3400 Hz may be attenuated to isolate the relevant portion of the signal. In the example depicted in FIG. 5 the cutoff frequency of the low pass filter is 4 kHz, although other cutoff frequencies may be used instead.

Next at [506] the low-pass filtered signal may be subjected to a zero crossing detector. A zero crossing detector is a voltage comparator that detects when a sinusoidal wave transitions from positive to negative (e.g., when the sinusoid crosses the 0 voltage condition) and vice versa. The zero crossing rate of voiced speech is typically low, while the zero crossing rate for unvoiced speech is high. Accordingly, the zero crossing detector at [506] is used to split the signal into voiced components (e.g., words and parts of speech) and unvoiced components (e.g., representations of sounds not due to speech, such as footsteps). On the unvoiced path, at [514] the energy level of the signal is repeatedly determined over time. At [516] a trend in the energy level of the signal is determined (e.g., using linear regression or Random Forest) and other statistics of the energy level of the signal may be determined. In general, a fitting function may be used to determine a line (e.g., energy level vs. time). A positive line slope (e.g., an increasing trend) may indicate motion toward the camera or audio device.

At [518] a determination may be made whether or not the trend from [516] has been increasing for a predefined amount of time (e.g., k epochs, or k time intervals) and whether the energy level is greater than a predefined energy level threshold $E_{th}$. If so, motion may be detected at [522]. Typically, an increase in the energy level trend of the unvoiced component of the signal $x_n$ represents sound moving toward the microphone. Accordingly, motion may be detected. As previously described, in some examples in response to detecting motion, an alert may be generated and/or video and/or audio may be streamed to one another computing devices. Conversely, at [520] if either the energy signal level is $<E_{th}$ or the trend is not increasing for the required amount of time, a determination may be made that no motion exists. Accordingly, the motion detector depicted in FIG. 5 does not trigger any further action.

At [508] the voiced component of the signal output by the zero crossing detector may be sent to recognized person filter 352. As previously described, the pitch period of the voiced input signal is determined (e.g., operation 420 of FIG. 4B) and is used as an input to the recognized person filter lookup table 402 (FIG. 4A). If a match is found in the recognized person filter lookup table 402 no further processing of the signal is performed. Conversely, if no match is found in the recognized person filter lookup table 402, recognized person filter 352 may determine the energy level of the signal (e.g., repeatedly over time). At [510] a trend in the energy level of the signal is determined (e.g., using linear regression) and other statistics of the energy level of the signal may be determined. At [512] a determination may be made whether or not the trend from [510] has been increasing for a predefined amount of time (e.g., k epochs, or k time intervals) and whether the energy level is greater than a predefined energy level threshold $E_{th}$. If so, motion may be detected at [522]. If not, at [524] it may be determined that the voice is coming from a static source (e.g., a stationary television, radio, a background voice, etc.). In response, at 524 the bias and/or noise floor of the devices may be adjusted as described above in reference to FIG. 1.

In the other signal path of FIG. 5 (e.g., on the right-hand side of FIG. 5), the average energy of the un-low pass filtered input audio signal $x_n$ may be determined at [526]. Additionally, at [528] a trend in the energy level of the signal is determined (e.g., using linear regression) and other statistics of the energy level of the signal may be determined. At [530] a determination may be made whether there has been a sudden change in the energy (e.g., whether the energy level follows a step-wise function and whether or not the energy level has changed by more than a threshold amount during a particular time period). If so, at [524] it may be determined that the increase (or decrease) in energy is due to a noisy electronic device (e.g., a television, doorbell, radio, etc.) being turned on (or off). Accordingly, the dynamic recalibration techniques described above in reference to FIG. 1 may be implemented. The bias of the front end audio amplifier and/or the noise floor threshold may be adjusted as previously described. At [532] if there is no sudden change in energy, a determination may be made that no noisy sound has been suddenly introduced (e.g., no music or television has been turned on).

Among other potential benefits, a system in accordance with the present disclosure may allow for motion to be detected based on audio. Additionally, dynamically recalibrating and/or retuning front end audio amplification of edge node devices (e.g., camera devices) may conserve battery life while maintaining effective sensitivity to sound in noisy environments. In at least some example embodiments, weather data and/or other data aggregated from external sources may be used to determine whether or not to dynamically retune front end audio electronics based on expected weather events and/or other noise. A recognized person filter may detect commonly used speech by authorized persons within a monitored area, and may thereby avoid triggering motion detection (e.g., false positives) due to commonly used speech by family members or otherwise authorized individuals in a security camera context. Finally, various embodiments described herein may distinguish between sounds that relate to movement of people and sounds that relate to noisy background sources such as radios, televisions, etc.

As set forth above, certain methods or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel or in some other manner. Blocks or states may be added to or removed from the disclosed example embodiments.

It will also be appreciated that various items may be stored in memory or on storage while being used, and that these items or portions thereof may be transferred between memory and other storage devices for purposes of memory management and data integrity. Alternatively, in other embodiments some or all of the software modules and/or systems may execute in memory on another device and communicate with the illustrated computing systems via inter-computer communication. Furthermore, in some embodiments, some or all of the systems and/or modules may be implemented or provided in other ways, such as at least partially in firmware and/or hardware, including, but not limited to, one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), etc. Some or all of the modules, systems and data structures may also be stored (e.g., as software instructions or structured data) on a computer-readable medium, such as a hard disk, a memory, a network or a portable media article to be read by an appropriate drive or via an appropriate connection. The systems, modules and data structures may also be sent as generated data signals (e.g., as part of a carrier wave or other analog or digital propagated signal) on a variety of computer-readable transmission media, including wireless-based and wired/cable-based media, and may take a variety of forms (e.g., as part of a single or multiplexed analog signal, or as multiple discrete digital packets or frames). Such computer program products may also take other forms in other embodiments. Accordingly, the present invention may be practiced with other computer system configurations.

Although the flowcharts and methods described herein may describe a specific order of execution, it is understood that the order of execution may differ from that which is described. For example, the order of execution of two or more blocks or steps may be scrambled relative to the order described. Also, two or more blocks or steps may be executed concurrently or with partial concurrence. Further, in some embodiments, one or more of the blocks or steps may be skipped or omitted. It is understood that all such variations are within the scope of the present disclosure.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. The various features and processes described above may be used independently of one another, or may be combined in various ways. All possible combinations and subcombinations are intended to fall within the scope of this disclosure.

In addition, conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Although this disclosure has been described in terms of certain example embodiments and applications, other embodiments and applications that are apparent to those of ordinary skill in the art, including embodiments and applications that do not provide all of the benefits described herein, are also within the scope of this disclosure. The scope of the inventions is defined only by the claims, which are intended to be construed without reference to any definitions that may be explicitly or implicitly included in any incorporated-by-reference materials.

What is claimed is:

1. A method comprising:
    generating, by a first microphone of a first camera device located at a first location in an environment, a first audio signal representing sound detected at the first location;
    generating, by a second microphone of a second camera device located at a second location in the environment, a second audio signal representing sound detected at the second location;
    determining, by the first camera device, a first energy level of the first audio signal at a first time;
    determining, by the first camera device, a second energy level of the first audio signal at a second time following the first time, wherein the second energy level is greater than the first energy level;
    determining, by the second camera device, a third energy level of the second audio signal at the first time;
    determining, by the second camera device, a fourth energy level of the second audio signal at the second time, wherein the fourth energy level is greater than the third energy level;
    determining, by the first camera device, that a first difference between the first energy level and the second energy level exceeds a threshold energy level difference, wherein the threshold energy level difference is used to trigger recalibration of audio electronics of the first camera device and the second camera device;
    determining, by the second camera device, that a second difference between the third energy level and the fourth energy level exceeds the threshold energy level difference;
    determining that the second energy level is greater than the fourth energy level; and increasing a bias of an audio amplifier of the first camera device.

2. The method of claim 1, further comprising:
generating, by a third microphone of a third camera device located at a third location in the environment, a third audio signal representing sound detected at the third location, wherein the third location is an outdoor location;
receiving, from a weather data service, an indication of an expected wind speed for the environment; and
increasing a bias of an audio amplifier of the third camera device based on the indication of the expected wind speed, wherein an amount of the increase in the bias is based at least in part on a magnitude of the wind speed.

3. The method of claim 1, further comprising:
determining, by the first camera device, a pitch period of a spoken name represented in the first audio signal;
determining that the determined pitch period does not correspond to any stored pitch periods to within a first tolerance value;
capturing video by the first camera device; and
sending the video to a first computing device.

4. The method of claim 1, further comprising:
determining a trend in energy levels of the first audio signal over a first time period;
determining that the trend indicates that the energy levels are increasing over the first time period;
capturing video by the first camera device; and
sending the video to a first computing device.

5. A method comprising:
determining a first energy level value of a first audio signal detected by a first microphone of a first device at a first time;
determining a second energy level value of the first audio signal detected by the first microphone of the first device at a second time after the first time;
determining a first difference value between the first energy level value and the second energy level value;
determining that the first difference value exceeds a threshold change value; and
adjusting a bias of a first audio amplifier of the first device by a first amount based at least in part on the second energy level value.

6. The method of claim 5, further comprising:
receiving, by the first device from a second device, a third energy level value of a second audio signal detected by a second microphone of the second device; and
determining, by the first device, a first bias value based at least in part on the third energy level value of the second audio signal, wherein the adjusting the bias of the first audio amplifier of the first device by the first amount comprises setting the bias of the first audio amplifier of the first device to the first bias value.

7. The method of claim 5, further comprising:
generating, by a second microphone of a second device, a second audio signal comprising ambient sound;
receiving weather information related to an environment of the second device; and
adjusting a bias of a second audio amplifier of the second device.

8. The method of claim 5, further comprising:
determining that energy level values of the first audio signal increase over a first period of time;
capturing video by a camera of the first device; and
sending the video to a first computing device.

9. The method of claim 5, further comprising:
generating, by the first microphone, a second audio signal over a first period of time; and
determining, using a zero crossing detector, a speech component and an non-speech component of the second audio signal.

10. The method of claim 9, further comprising:
determining a pitch period of at least a portion of the speech component of the second audio signal;
determining that the determined pitch period does not correspond to any stored pitch periods stored in a database;
determining that energy level values of the second audio signal increase over the first period of time; and
determining that a human motion event has occurred.

11. The method of claim 9, further comprising:
determining energy level values of the non-speech component of the second audio signal over the first period of time;
determining that the energy level values of the non-speech component of the second audio signal increase over the first period of time; and
determining that a human motion event has occurred based at least in part on the determination that the trend in the energy level values of the non-speech component of the second audio signal is increasing over the first period of time.

12. The method of claim 5, wherein the second energy level value is higher than the first energy level value, and wherein the adjusting the bias of the first audio amplifier of the first device by the first amount comprises increasing the bias by the first amount.

13. A system comprising:
at least one processor;
a microphone;
a first audio amplifier; and
a memory storing instructions that when executed by the at least one processor causes the at least one processor to perform a method comprising:
determining a first energy level value of a first audio signal detected by the microphone at a first time;
determining a second energy level value of the first audio signal detected by the microphone at a second time after the first time;
determining a first difference value between the first energy level value and the second energy level value;
determining that the first difference value exceeds a threshold change value; and
adjusting a bias of the first audio amplifier by a first amount based at least in part on the second energy level value.

14. The system of claim 13, wherein the microphone is located at an outdoor location, and wherein the instructions when executed by the at least one processor cause the at least one processor to perform the method further comprising:
generating, by a second microphone of a second device, a second audio signal comprising ambient sound;
receiving weather information related to an environment of the second device; and
adjusting a bias of a second audio amplifier of the second device.

15. The system of claim 13, further comprising a second computing device, and wherein the instructions when executed by the at least one processor cause the at least one processor to perform the method further comprising:
determining that energy level values of the first audio signal increase over a first period of time;

capturing video by a camera of the system; and sending the video to the second computing device.

16. The system of claim 13, wherein the computing device is a first device, and wherein the instructions when executed by the at least one processor cause the at least one processor to perform the method further comprising:

generating, by the microphone, a second audio signal over a first period of time; and determining, using a zero crossing detector, a speech component and an non-speech component of the second audio signal.

17. The system of claim 16, wherein the instructions when executed by the at least one processor cause the at least one processor to perform the method further comprising:

determining a pitch period of at least a portion of the speech component of the second audio signal;

determining that the determined pitch period does not correspond to any stored pitch periods stored in a database;

determining that energy level values of the second audio signal increase over the first period of time; and determining that a human motion event has occurred.

18. The system of claim 16, wherein the instructions when executed by the at least one processor cause the at least one processor to perform the method further comprising:

determining energy level values of the non-speech component of the second audio signal over the first period of time;

determining that the energy level values of the non-speech component of the second audio signal increase over the first period of time; and determining that a human motion event has occurred based at least in part on the determination that the trend in the energy level values of the non-speech component of the second audio signal is increasing over the first period of time.

19. The system of claim 13, wherein the adjusting the bias of the first audio amplifier comprises increasing the bias by the first amount.

20. The system of claim 13, wherein the instructions when executed by the at least one processor cause the at least one processor to perform the method further comprising:

receiving, from a second device, a third energy level value of a second audio signal detected by a second microphone of the second device; and determining, by the at least one processor, a first bias value based at least in part on the third energy level value of the second audio signal, wherein the adjusting the bias of the first audio amplifier by the first amount comprises setting the bias of the first audio amplifier to the first bias value.

* * * * *